United States Patent
Bromberger

(10) Patent No.: US 7,348,221 B2
(45) Date of Patent: Mar. 25, 2008

(54) PROCESS FOR MANUFACTURING A SEMICONDUCTOR DEVICE, A SEMICONDUCTOR DEVICE AND A HIGH-FREQUENCY CIRCUIT

(75) Inventor: Christoph Bromberger, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 51 days.

(21) Appl. No.: 11/242,792

(22) Filed: Oct. 5, 2005

(65) Prior Publication Data
US 2006/0071214 A1     Apr. 6, 2006

(30) Foreign Application Priority Data
Oct. 5, 2004    (DE)   ................ 10 2004 048 332

(51) Int. Cl.
   *H01L 21/335*      (2006.01)
   *H01L 21/336*      (2006.01)
   *H01L 21/8232*     (2006.01)

(52) U.S. Cl. ............... 438/142; 438/301; 438/302; 438/279

(58) Field of Classification Search ........ 438/142, 438/301, 302, 279, 587, 157
See application file for complete search history.

(56) References Cited

U.S. PATENT DOCUMENTS

| | | | |
|---|---|---|---|
| 5,254,484 A | 10/1993 | Hefner et al. | |
| 5,534,716 A | 7/1996 | Takemura | |
| 5,994,191 A | 11/1999 | Xiang et al. | |
| 6,338,991 B1 | 1/2002 | Zhang et al. | |
| 2004/0147074 A1* | 7/2004 | Sell et al. | 438/243 |
| 2006/0071214 A1* | 4/2006 | Bromberger | 257/70 |

FOREIGN PATENT DOCUMENTS

DE     40 35 842 C2     5/1992

OTHER PUBLICATIONS

Jeong-Hee Oh et al., "Enhanced Growth Mechanism in Lateral Solid-Phase Epitaxy of Si Films Simultaneously Doped with P and Ge Atoms," Jpn. J. Appl. Phys. vol. 35 (1996), pp. 1605-1610, Part 1, No. 3, Mar. 1996.
D. Widmann et al., "Technologie hochintegrierter Schaltungen," 2nd Edition, Springer 1996, ISBN 3-540-59357-8, p. 183.
Denise L. Leung et al., "A Complementary Metal Oxide Semiconductor Process in Epitaxially Regrown Silicon over Oxide," Journal of the Electrochemical Society, 138 (1991), No. 12, pp. 3771-3777.
A.V. Zotov et al., "Present Status of Solid Phase Epitaxy of Vacuum-Deposited Silicon," Journal of Crystal Growth, 98 (1989), pp. 519-530.

(Continued)

*Primary Examiner*—Walter L Lindsay, Jr.
(74) *Attorney, Agent, or Firm*—Geissler, Olds & Lowe, PLLC

(57) ABSTRACT

A process for manufacturing a semiconductor device, provides that a silicide layer is formed, an amorphous semiconductor layer is applied both to the silicide layer and to an open monocrystalline semiconductor region, adjacent to the silicide layer, and during a subsequent temperature treatment, the amorphous semiconductor layer is crystallized proceeding from the open, monocrystalline semiconductor region, acting as a crystallization nucleus, so that the silicide layer is covered at least partially by a crystallized, monocrystalline semiconductor layer.

33 Claims, 2 Drawing Sheets

OTHER PUBLICATIONS

Masayoshi Sasaki et al., "*Lateral solid phase epitaxy of Si over $SiO_2$ patterns and its application to silicon-on-insulator transistors*," Applied Physics Letters, 49(7), 1996, pp. 397-399.

K. Kusukawa et al., "*Effects of thin $SiO_2$ capping layer on silicon-onl-insulator formation by lateral solid-phase epitaxy*," Applied Physics Letters, 60(1), 1992, pp. 80-81.

K. Kusukawa et al., "*Grown-facet-dependent characteristics of silicon-on-insulator by lateral solid phase epitaxy*," Applied Physics Letters, 52 (20), 1988, pp. 1681-1683.

Hiroshi Ishiwara et al., "*Lateral solid phase epitaxy of amorphous Si films and Si substrates with $SiO_2$ patterns*," Applied Physics Letters, 43(11), 1983, pp. 1028-1030.

Masahiro Moniwa et al., "*Influence of Si film thickness on growth enhancement in Si lateral solid phase epitaxy*," Applied Physics Letters, 52(21), 1988, pp. 1788-1790.

K. Kusukawa et al., "*Enhancement of lateral solid phase epitaxy over $SiO_2$ using a densified and thinned amorphous Si layer*," Applied Physics Letters, 56(6), 1990, pp. 560-562.

Hiroshi Ishiwara et al., "*Lateral solid phase epitaxy of amorphous Si films onto nonplanar $SiO_2$ patterns on Si substrates*," Applied Physics Letters, 48(12), 1986, pp. 773-775.

Toru Dan et al., "*Lateral solid phase epitaxy of amorphous Si films by selective surface doping method of P atoms*," Applied Physics Letters, 53(26), 1988, pp. 2626-2628.

Hiroshi Ishiwara et al., "*Lateral solid phase epitaxy in selectively P-doped amorphous Si films*," Applied Physics Letters, 49(20), 1986, pp. 1363-1365.

M. Miyao et al., "*Low-temperature SOI (Si-on-insulator) formation by lateral solid-phase epitaxy*," Journal of Applied Physics, 64(6), 1988, pp. 3018-3023.

Hiroshi Ishiwara et al., "*Selective Surface Doping Method of P Atoms in Lateral Solid Phase Epitaxy and its Applications to Device Fabrication*," Japanese Journal of Applied Physics, 31, 1992, pp. 1695-1701.

\* cited by examiner

PROCESS FOR MANUFACTURING A SEMICONDUCTOR DEVICE, A SEMICONDUCTOR DEVICE AND A HIGH-FREQUENCY CIRCUIT

This nonprovisional application claims priority under 35 U.S.C. § 119(a) on German Patent Application No. DE 102004048332.9, which was filed in Germany on Oct. 5, 2004, and which is herein incorporated by reference.

BACKGROUND OF THE INVENTION

1. Field of the Invention

The present invention relates to a process for manufacturing a semiconductor device, a semiconductor device, and a high-frequency circuit.

2. Description of the Background Art

Various manufacturing variants for semiconductor components by partial overgrowth of oxide layers with monocrystalline silicon by solid phase epitaxy are described in the Journal of the Electrochemical Society, 138 (1991), No. 12, pp. 3771-3777; Journal of Crystal Growth 98 (1989), pp. 519-530; Applied Physics Letters, 49(7), 1996, pp. 397-399; Applied Physics Letters, 60(1), 1992, pp. 80-81; Applied Physics Letters, 52(20), 1988, pp. 1681-1683; Applied Physics Letters, 43(11), 1983, pp. 1028-1030; Applied Physics Letters, 52(21), 1988, pp. 1788-1790; Applied Physics Letters, 56(6), 1990, pp. 560-562; Applied Physics Letters, 48(12), 1986, pp. 773-775; Applied Physics Letters, 53(26), 1988, pp. 2626-2628; Applied Physics Letters, 49(20), 1986, pp. 1363-1365; Journal of Applied Physics, 64(6), 1988, pp. 3018-3023; Japanese Journal of Applied Physics, 35, 1996, pp. 1605-1610; and the Japanese Journal of Applied Physics, 31, 1992, pp. 1695-1701. Here, an oxide layer is first applied to a silicon wafer. Seed windows where the monocrystalline lattice of the wafer is exposed are opened in the oxide layer. An amorphous silicon layer is then applied and crystallized outwardly from the seed openings.

It is known from U.S. Pat. No. 5,534,716 to crystallize a film layer of silicon in a predetermined direction. In this regard, selective metal atoms are added that have a catalytic action for the crystallization of amorphous silicon. This is used for manufacturing a TFT (Thin Film Transistor) with a high critical frequency or a TFT with a low leak current on the same substrate. It is specified that transition metal impurities lower the nucleation temperature on the silicon below the growth temperature for nuclei.

SUMMARY OF THE INVENTION

It is therefore an object of the present invention to provide a process for manufacturing a semiconductor device, a semiconductor device and a high-frequency circuit, monocrystalline semiconductor material being produced over a silicide layer to improve the electrical properties as much as possible.

A feature of the invention is a manufacturing process step in which during a temperature treatment, an amorphous semiconductor layer is crystallized proceeding from an open, monocrystalline semiconductor region, acting as a crystallization nucleus, so that a silicide layer is covered at least partially by a crystallized, monocrystalline semiconductor layer. To this end, the silicide layer is formed beforehand and preferably the amorphous semiconductor layer is applied afterwards both to the silicide layer and to the open, monocrystalline semiconductor region adjacent to the silicide layer.

Tests by the applicant have shown that, contrary to the prevalent bias, it is possible to apply monocrystalline semiconductor regions to silicide layers according to the process of the invention without costly processes, such as a process for growing monocrystalline silicon layers on certain silicon lattice-adapted silicides such as $ErSi_2$ or $Co-Si_2$, by molecular beam epitaxy; or a process for growing layers, which includes a matrix continuing the crystal lattice of the substrate epitactically, in which non-lattice-adapted silicide crystallites are embedded in a thin layer, the crystallites joining together into a continuous silicide layer by subsequent annealing.

In an embodiment of the invention, the silicide layer is made of titanium as a transition metal and silicon as the semiconductor material.

In fact, a crystallization direction, exclusively vertical relative to the wafer surface, is basically possible; the amorphous semiconductor layer is also crystallized substantially laterally in a preferred embodiment of the invention. This can naturally be combined advantageously with a vertical crystallization direction.

A further embodiment of the invention provides that the crystallization occurs within a temperature range between, for example, 400° C. and 600° C. In so doing, the temperature during the process depends on the employed silicide. The temperature in this embodiment can be selected in such a way that metal ions of the silicide layer do not significantly contaminate the adjacent monocrystalline semiconductor layer for the critical functioning of the semiconductor layer.

Advantageously, the amorphous silicon layer is applied with a layer thickness of at least 300 nm, preferably at least one region of the amorphous semiconductor layer being doped with at least one dopant, particularly with germanium, phosphorus, boron, and/or arsenic, to control the crystal growth and the nucleation rate during the manufacturing process.

In a further embodiment, the dopant can be introduced in a preferably 250 nm-thick surface region of the amorphous silicon layer, in particular by implantation. To again remove this high-doped region, which interferes with functioning, regions, doped with the dopant, of the crystallized monocrystalline semiconductor layer, are selectively etched, particularly wet chemically, in that the regions doped with the dopant have a higher etching rate than a less doped region of the crystallized, monocrystalline semiconductor layer.

After the etching of the doped regions of the crystallized, monocrystalline semiconductor layer, the crystallized, monocrystalline semiconductor layer can be oxidized at the surface. The oxide can be subsequently removed, preferably by a wet chemical process.

A further embodiment includes the selective removal of non-monocrystalline regions of the semiconductor layer after the crystallization. Preferably, the monocrystalline semiconductor layer is subsequently planarized to the level of the surface of the dielectric.

A first example embodiment of the invention enables a selective removal of the non-monocrystalline regions of the semiconductor layer by a poly-etching. A second possible example embodiment provides an alternative of a selective removal of the non-monocrystalline regions of the semiconductor layer by a masked dry etching.

In order to produce additional active regions of a component, after the removal of the non-monocrystalline regions of the semiconductor layer, the monocrystalline layer can be thickened by epitaxy, preferably by selective vertical epitaxy.

Several different semiconductor layers, made of different semiconductor materials, such as Si or SiGe, may be applied by epitaxial thickening. Moreover, semiconductor regions with different conduction types, n-conducting or p-conducting, are provided to form pn junctions of a bipolar transistor or a diode.

Dislocation of the surface between the silicide layer and the seed opening is also possible. The silicide layer can be formed in such a way that the monocrystalline semiconductor region forms a substantially flat surface with the silicide layer at least in the region of crystallization.

Another aspect of the invention is a process for manufacturing a semiconductor device, which can be combined with the previously disclosed process steps. To this end, at least one trench structure is introduced in a region of the substrate of a wafer with monocrystalline semiconductor material. The trench structure may be introduced, for example, by isotropic or anisotropic etching and, for example, form a V-shaped trench along the <111> orientation of the semiconductor lattice of the substrate.

Furthermore, a silicide layer, for example, a titanium silicide layer, can be formed at least in subregions of the trench structure. The trench structure is filled with a dielectric at least above the silicide layer. That dielectric can be made of silicon dioxide.

The silicide layer can be formed by applying a layer of a transition metal to the device of a semiconductor substrate with an introduced trench structure and an overlying mask. In this regard, the transition metal is capable of reacting with the semiconductor substrate to form a conductive semiconductor-transition metal bond as the silicide layer. A reaction between the transition metal and the semiconductor substrate is carried out, the unreacted remainder of the transition metal being removed afterwards.

A mask can be applied to the surface regions of the semiconductor substrate, which is not patterned by the trench structure. The mask can be formed of a silicon dioxide layer and a silicon nitride layer, which is thicker than the silicon dioxide layer, the silicon dioxide layer being applied by thermal oxidation and the silicon nitride layer being deposited afterwards.

In order to have a surface as flat as possible available for the subsequent process steps, the dielectric is planarized down to the height of the upper edge of the mask in an advantageous development of the invention. Here, the silicon nitride layer of the mask advantageously serves as a planarization stop. Preferably, in so doing, the planarization occurs by means of chemical-mechanical polishing.

The mask is removed after the planarization. Therefore, outside the trench structure, the monocrystalline silicon substrate and the edge of the silicide layer is open at the surface. Preferably, after the mask is removed, the amorphous semiconductor layer is applied, which therefore covers the monocrystalline silicon substrate and preferably also the dielectric at least partially.

The described process steps make possible the manufacture of semiconductor components with additional process steps, such as the application of metallizing layers. An essential aspect of the invention is an application of said manufacturing process for manufacturing a permeable base transistor, a resonance tunnel transistor, and/or a resonance tunnel diode, which may be realized also together on a semiconductor substrate.

Another aspect of the invention is a semiconductor device with at least one silicide layer, the silicide layer being covered at least partially with a monocrystalline semiconductor layer. The monocrystalline semiconductor layer is crystallized from an amorphous semiconductor material applied to the silicide layer. In this regard, the crystallization occurs proceeding from a monocrystalline semiconductor region as a crystallization nucleus.

Preferably, the monocrystalline semiconductor region forms a substantially flat surface with the silicide layer at least in the region of crystallization. Above this surface, the monocrystalline semiconductor layer is applied, which preferably serves as an active semiconductor region of a component preferably with additional semiconductor layers.

Further, a dielectric, which covers the silicide layer at least partially, can be adjacent to the crystallized, monocrystalline semiconductor layer. It is preferred, in this regard, to separate the silicide layer and other active regions of the same or an adjacent component by the dielectric.

The silicide layer can be applied to the monocrystalline semiconductor region at least partially along a trench structure. It is preferable for the trench structure to be filled at least partially, preferably completely, with the dielectric. This makes it possible to distance the silicide layer from the metallization, contacts, and other active regions of a semiconductor component placed on the dielectric. The filled dielectric can be planarized, in order to be able to apply complex metallization.

The monocrystalline semiconductor layer can be doped by dopants at the border to the silicide layer, which diffuse out of the buried silicide layer acting as a dopant source.

In a further embodiment, a high-frequency circuit is provided with a semiconductor device having at least one silicide layer, which connects electrically a buried, doped semiconductor layer of an active high-frequency component, whereby the silicide layer can be covered at least partially with a monocrystalline semiconductor layer crystallized from an amorphous semiconductor material. A dielectric, which fills a trench structure, can be placed between a base connection and the silicide layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

During the crystallization of amorphous substances, two temperature-dependent variables, the nucleation rate and the crystal growth rate, influence the quality and properties of the crystallized layer. If polycrystalline grains have already formed on an oxide, a lateral solid phase epitaxy, progressing from the crystallization nuclei, at the grain boundaries stops. With undoped amorphous Si, in this way, approximately 4-μm oxide can be overgrown laterally, in a monocrystalline manner, and with a good crystal quality. It is possible in this regard that the lateral expansion of the monocrystalline region is about 10 times the layer thickness. With high phosphorus-, boron-, or germanium-doped amorphous silicon, in contrast, between 20 μm and 40 μm may be overgrown. Selective etching of a high-doped layer, moreover, can also form thinner layers of crystallized amorphous silicon.

Transition metal impurities, for example, nickel, increase the crystal formation rate at low temperatures. The doping with transition metals may be used, for example, for manufacturing thin-layer transistors. If thereby free metal ions diffuse from a silicide layer into the overyling amorphous silicon in notable amounts, overgrowing of silicide layers with lateral solid phase epitaxy of silicon appears impossible.

However, it is indicated in the following exemplary embodiments depicted as drawings that there is a temperature range for many silicides in which the lateral solid phase epitaxy, proceeding from a seed opening designated as a crystallization nucleus, leads to a crystal growth rate, whereas at the same time the outward diffusion of transition metal ions from the silicide layer into the overlying silicon layer is so low that the crystallization rate is not increased to a prohibitively great extent.

Figure 1A:
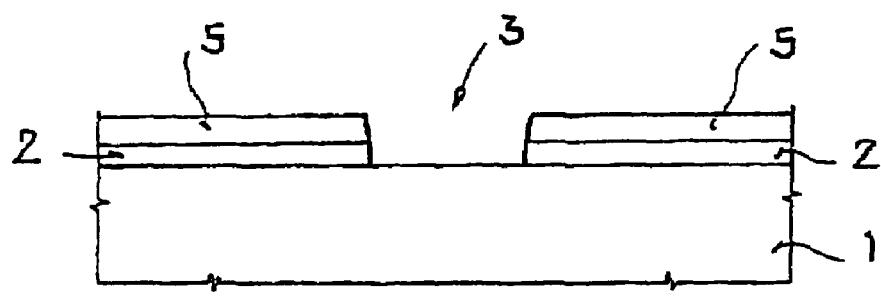
FIG. 1a is a schematic drawing, after several first manufacturing steps, of a manufacturing process according to an embodiment of the present invention.

FIG. 1a shows a schematic drawing after several first manufacturing steps in the manufacturing process of an initial embodiment of a semiconductor device. Shown is the state after application of a silicide layer 2 to a monocrystalline silicon semiconductor substrate 1. A mask 5, for example, of photoresist, is applied to the silicide layer 2 and a seed window 3 is etched in the silicide layer 2.

Figure 1B:
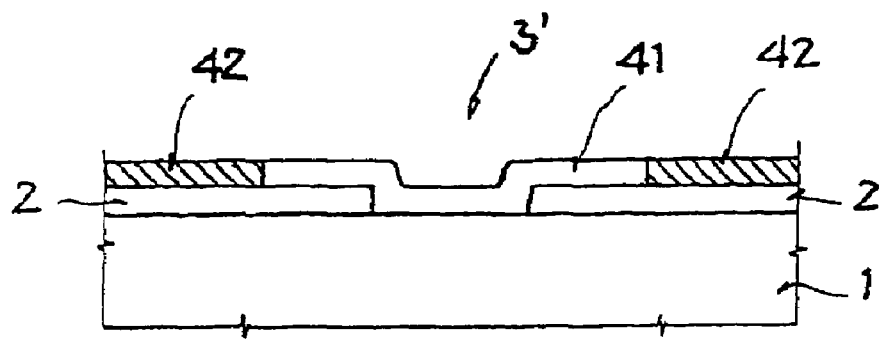
FIG. 1b is a schematic drawing, after several additional manufacturing steps, of the manufacturing process.

FIG. 1b shows the manufacturing state after additional manufacturing process steps. Here, an amorphous silicon layer is applied, which is not shown in FIG. 1b and has a thickness of 300 nm. The top 250 nm, with respect to the surface, of the amorphous silicon layer are doped with high doses of a dopant arsenic by implanting the arsenic dopants in the amorphous silicon layer. Other suitable foreign substances are, for example, also boron, phosphorus, or germanium. These dopants require the subsequent lateral solid phase epitaxy, whereby FIG. 1b schematically shows the manufacturing state after a completed solid phase epitaxy.

The lateral solid phase epitaxy occurs in this case within a temperature range between 400° C. and 600° C., which is selected in keeping with a low rate of diffusion of transition metals from the silicide layer 2 into a crystallized, monocrystalline semiconductor layer 41, which is, for example, Si or SiGe. The crystallized, monocrystalline semiconductor layer 41, obtained by solid phase epitaxy, thereby covers the filled seed window 3' and also adjacent regions of the silicide layer 2. The crystallized, monocrystalline semiconductor layer 41, however, ends at polycrystalline regions, which arise by spontaneous crystal formation from the amorphous silicon layer at a distance from the seed window 3.

In the following steps, not shown in the drawing, the regions, doped by the foreign substances, of the crystallized, monocrystallized semiconductor layer 41 are chemically removed, whereby these foreign substances in sufficiently high concentration makes sections of the silicon in the crystallized, monocrystalline semiconductor layer 41 susceptible to chemical removal, and whereby monocrystalline undoped or low-doped silicon resists etching. In this exemplary embodiment, a phosphorus doping of 7e18 cm-3 and etching in HF:HNO3 CH3OOOH=1:3:8 are planned.

Figure 2A:
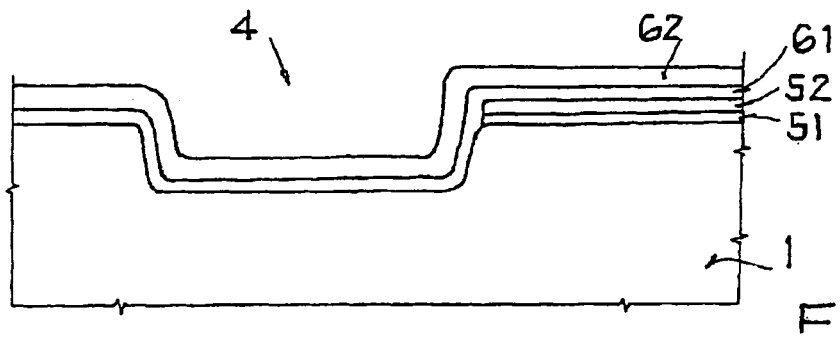
FIG. 2a is a schematic drawing, after several first manufacturing steps, of a manufacturing process according to a second embodiment of the present invention.

FIG. 2a shows a schematic drawing after several first manufacturing steps in the manufacturing process of a second embodiment of a semiconductor device for a high-frequency bipolar transistor.

In this regard, the manufacturing process comprises the following process steps. First, a semiconductor substrate 1 is provided including a first monocrystalline semiconductor material, in this exemplary embodiment, silicon. A patterned mask is then applied, which in this exemplary embodiment is a thin silicon dioxide layer 51 and a thicker silicon nitride layer 52. At trench structure 4 is patterned by etching at the sites not protected by the mask 51, 52.

A silicide layer is then formed by applying a tungsten layer 61 and a cobalt layer 62. This manufacturing state after application of the tungsten layer 61 and the cobalt layer 62 is shown in FIG. 2a. The transition metals, tungsten and cobalt, are capable of reacting with the silicon substrate to form a semiconductor-transition metal bond.

Figure 2B:
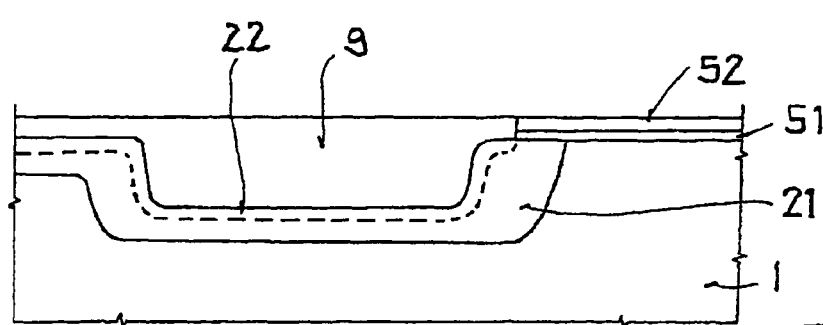
FIG. 2b is a schematic drawing, after several additional manufacturing steps, of the manufacturing process of the second embodiment.

After the reaction, unreacted remainders of the transition metals are removed. The reaction causes a cobalt silicide layer 21 and a tungsten silicide layer 22 adjacent to the cobalt layer, to form within the trench structure 4. The trench structure 4 is filled with a dielectric 9, for example, silicon dioxide. Planarization by chemical-mechanical polishing then occurs down to the height of the mask layer 52 of the silicon nitride. This process state is shown in FIG. 2b.

Figure 2C:
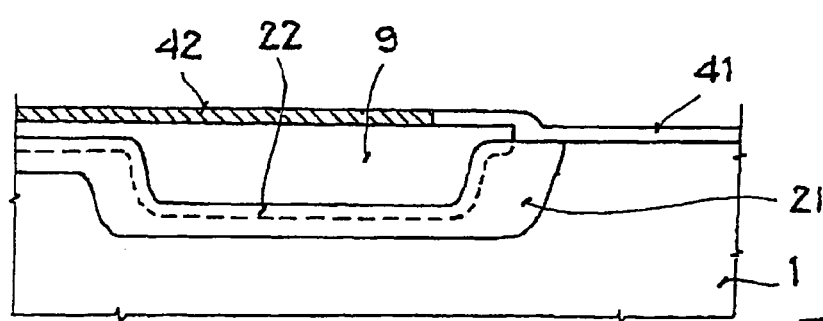
FIG. 2c is a schematic drawing, after several additional manufacturing steps, of the manufacturing process of the second embodiment.

Next, after removal of the solid mask of oxide 51 and nitride 52, used for the trench etching, a layer of amorphous silicon is applied, which is converted by a lateral solid phase epitaxy, as described for FIGS. 1a and 1b, at least in subregions into a crystallized, monocrystalline semiconductor layer. This state is shown in FIG. 2c. In contrast to FIGS. 1a and 1b, the silicide layers 21 and 22 form a flat surface with the monocrystalline semiconductor substrate 1 within the seed opening bounded by the dielectric 9. The region of the crystallized, monocrystalline semiconductor layer 41, in so doing, extends beyond the height of the seed opening to regions covered at least partially by the dielectric 9. The monocrystalline crystal growth is in turn bounded by a polycrystalline layer 42 forming spontaneously from the amorphous silicon layer.

In the next steps, the polycrystalline regions 42 are removed by appropriate masking and subsequent dry etching. Next, the monocrystalline silicon layer 41 is planarized by chemical-mechanical polishing down to the height of the dielectric 9.

Figure 2D:
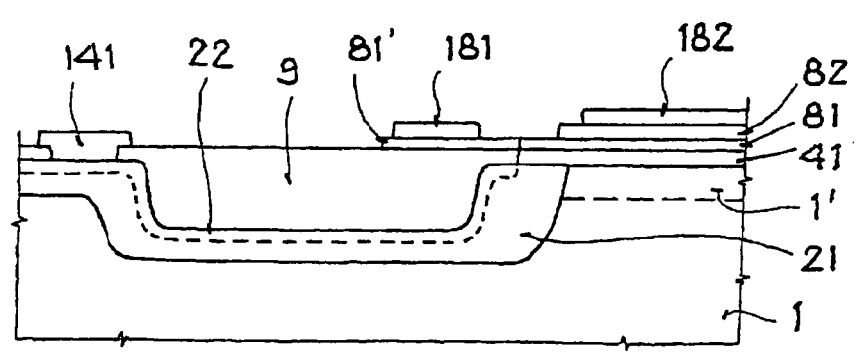
FIG. 2d is a schematic drawing of a section of a high-frequency bipolar transistor.

FIG. 2d shows a partial view of the final state of the manufacturing processs, which in this exemplary embodiment shows a high-frequency bipolar transistor. A high-doped region 1' is created in addition in the substrate; it borders the silicide layer 21 and with it enables a low-resistance connection of a collector semiconductor region 41 of low-doped monocrystalline silicon. An internal base semiconductor region 81, which is connected via an external base semiconductor region 81' with the metal connection

181 of the base, is applied to the collector semiconductor region by vertical solid phase epitaxy.

A monocrystalline emitter semiconductor region 82, which is connected to the metal connection 182 for electrical contacting, is applied in turn, for example, by subsequent solid phase epitaxy via the internal base semiconductor region 81. For reduced connection resistance, additional silicide layers can be provided (not shown in FIG. 2*d*) between the metal contacts 181 and 182 and the semiconductor regions 81' and 82. The dielectric 9 separates the base connection 181 from the silicide layers 21 and 22 for the low-resistance contacting of the collector semiconductor region 41. By this means, a low parasitic base collector capacity is achieved and the high-frequency properties of this bipolar transistor is significantly improved. Furthermore, the high-frequency properties of this bipolar transistor are improved by connecting the collector in a low-resistance manner by means of the silicide layers 21 and 22. The silicide layer is connected via a collector metal contact 141 on the trench structure 9 side opposite the collector semiconductor region 41.

The manufacturing process is not limited to the manufacture of high-frequency bipolar transistors. Thus, for example, tunnel diodes or permeable base transistors may also be manufactured by the manufacturing process.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A process for manufacturing a semiconductor device, the steps comprising:
    forming a silicide layer;
    applying an amorphous semiconductor layer to the silicide layer and to an open monocrystalline semiconductor region that is adjacent to the silicide layer; and
    crystallizing, during a subsequent temperature treatment, the amorphous semiconductor layer proceeding from the open monocrystalline semiconductor region, which functions as a crystallization nucleus, so that the silicide layer is at least partially covered by a crystallized, monocrystalline semiconductor layer.

2. The process according to claim 1, wherein the silicide layer is made of titanium as the transition metal and silicon as the semiconductor material.

3. The process according to claim 1, wherein the amorphous semiconductor layer is substantially crystallized laterally.

4. The process according to claim 1, wherein the crystallization occurs within a temperature range between 400° C. and 600° C.

5. The process according to claim 1, wherein the amorphous silicon layer is applied with a layer thickness of at least 300 nm.

6. The process according to claim 1, wherein at least one region of the amorphous semiconductor layer is doped with at least one dopant, the dopant being germanium, phosphorus, boron, and/or arsenic.

7. The process according to claim 6, wherein the dopant is introduced in a 250 nm-thick surface region of the amorphous silicon layer by implantation.

8. The process according to claim 6, wherein regions, doped with the dopant, of the crystallized monocrystalline semiconductor layer are selectively etched, and wherein the regions, doped with the dopant, have a higher etching rate than a less doped region of the crystallized monocrystalline semiconductor layer.

9. The process according to claim 8, wherein, after etching of the doped regions of the crystallized monocrystalline semiconductor layer, the crystallized monocrystalline semiconductor layer is oxidized at a surface thereof and oxide is removed by a wet chemical process.

10. The process according to claim 1, wherein, after crystallization, non-monocrystalline regions of the semiconductor layer are selectively removed and the monocrystalline semiconductor layer is planarized to a level of a surface of a dielectric.

11. The process according to claim 10, wherein the non-monocrystalline regions of the semiconductor layer are selectively removed by a poly-etching process.

12. The process according to claim 10, wherein the non-monocrystalline regions of the semiconductor layer are removed by a masked dry etching process.

13. The process according to claim 10, wherein, after removal of the non-monocrystalline regions of the semiconductor layer, the monocrystalline layer is thickened by epitaxy or selective epitaxy.

14. The process according to claim 1, wherein the silicide layer is formed in such a manner that the monocrystalline semiconductor region forms a substantially flat surface with the silicide layer, at least in a region of crystallization.

15. The process according to claim 1, wherein the silicide layer is formed so that a surface of the silicide layer is raised relative to a surface of the monocrystalline semiconductor region, at least in a region of crystallization.

16. A process for manufacturing a semiconductor device, the process comprising the steps of:
    introducing at least one trench structure into a region of a substrate of a wafer having monocrystalline semiconductor material;
    forming a silicide layer at least in subregions of the trench structure; and
    filling the trench structure with a dielectric at least in a region above the silicide layer.

17. The process according to claim 16, wherein the dielectric is made of silicon dioxide.

18. The process according to claim 16, wherein the silicide layer is formed with the steps comprising:
    applying a layer of a transition metal to the device of the semiconductor substrate with an introduced trench structure and an overlying mask, the transition metal being capable of reacting with the semiconductor substrate to form a conductive semiconductor-transition metal bond as the silicide layer,
    performing a reaction between the transition metal and the semiconductor substrate; and
    removing unreacted remainders of the transition metal.

19. The process according to claim 16, wherein a mask is applied to surface regions of the semiconductor substrate, which are not patterned by the trench structure.

20. The process according to claim 19, wherein the mask is formed of a silicon dioxide layer and a silicon nitride layer, which is thicker than the silicon dioxide layer.

21. The process according to claim 19, wherein the dielectric is planarized to a height of an upper edge of the mask.

22. The process according to claim 21, wherein the planarization is performed by chemical-mechanical polishing.

23. The process according to claim 22, wherein, after the planarization, the mask is removed, and after removal of the mask, an amorphous semiconductor layer is applied.

24. The process according to claim 1, wherein the semiconductor device is a permeable base transistor.

25. The process according to claim 1, wherein the semiconductor device is a resonance tunnel transistor.

26. The process according to claim 1, wherein the semiconductor device is a resonance tunnel diode.

27. The process according to claim 16, wherein the dielectric fills the at least one trench structure at least to a height above an upper surface of the semiconductor substrate.

28. The process according to claim 27, wherein a mask is applied to a region of the upper surface of the semiconductor substrate that is not patterned by the trench structure, and wherein the dielectric fills the at least one trench structure at least to a height of an upper edge of the mask.

29. The process according to claim 28, wherein the dielectric is planarized to the height of the upper edge of the mask.

30. The process according to claim 29, wherein, after the planarization, the mask is removed, and after removal of the mask, an amorphous semiconductor layer is applied.

31. A process for manufacturing a semiconductor device, the process comprising:

introducing at least one trench structure into a region of a substrate of a wafer having monocrystalline semiconductor material, wherein a mask is applied to surface regions of the semiconductor substrate, which are not patterned by the at least one trench structure;

forming a silicide layer at least in subregions of the at least one trench structure; and filling the at least one trench structure above the silicide layer with a dielectric, wherein the dielectric fills the at least one trench structure at least to a height of an upper edge of the mask.

32. The process according to claim 31, wherein the dielectric is planarized to a height of an upper edge of the mask.

33. The process according to claim 31, wherein the forming of the silicide layer comprises:

applying a layer of a transition metal to the device of the semiconductor substrate having the at least one trench structure and an overlying mask, the transition metal being capable of reacting with the semiconductor substrate to form a conductive semiconductor-transition metal bond as the silicide layer;

performing a reaction between the transition metal and the semiconductor substrate; and removing unreacted remainders of the transition metal.

* * * * *